(12) United States Patent
Leobandung

(10) Patent No.: US 9,263,512 B2
(45) Date of Patent: Feb. 16, 2016

(54) MEMORY CELL WITH INTEGRATED III-V DEVICE

(71) Applicant: International Business Machines Corporation, Armonk, NY (US)

(72) Inventor: Effendi Leobandung, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 23 days.

(21) Appl. No.: 13/924,986

(22) Filed: Jun. 24, 2013

(65) Prior Publication Data

US 2014/0374878 A1 Dec. 25, 2014

(51) Int. Cl.
H01L 49/02 (2006.01)
H01L 27/108 (2006.01)
H01L 29/66 (2006.01)
H01L 29/94 (2006.01)

(52) U.S. Cl.
CPC .......... *H01L 28/40* (2013.01); *H01L 27/10832* (2013.01); *H01L 27/10861* (2013.01); *H01L 27/10867* (2013.01); *H01L 29/66181* (2013.01); *H01L 29/945* (2013.01)

(58) Field of Classification Search
CPC .................................................. H01L 27/10844
USPC ......................................... 438/243, 386, 455
See application file for complete search history.

(56) References Cited

U.S. PATENT DOCUMENTS

| | | | |
|---|---|---|---|
| 5,346,848 A | | 9/1994 | Grupen-Shemansky et al. |
| 5,395,481 A | * | 3/1995 | McCarthy ..................... 438/479 |
| 2010/0283093 A1 | * | 11/2010 | Pei et al. ....................... 257/303 |
| 2013/0022072 A1 | | 1/2013 | Bowers |
| 2013/0134490 A1 | * | 5/2013 | Nummy et al. ............... 257/301 |

FOREIGN PATENT DOCUMENTS

| | | |
|---|---|---|
| CN | 1688014 | 10/2005 |
| CN | 102446958 | 5/2012 |
| CN | 102543882 | 7/2012 |
| EP | 1130647 | 8/2007 |
| KR | 1020090043109 | 5/2009 |

* cited by examiner

*Primary Examiner* — Yu-Hsi D Sun
(74) *Attorney, Agent, or Firm* — Scully, Scott, Murphy & Presser, P.C.

(57) ABSTRACT

A method including forming an oxide layer on a top of a substrate; forming a deep trench capacitor in the substrate; bonding a III-V compound semiconductor to a top surface of the oxide layer; and forming a III-V device in the III-V compound semiconductor.

13 Claims, 6 Drawing Sheets

MEMORY CELL WITH INTEGRATED III-V DEVICE

BACKGROUND

1. Field of the Invention

The present invention generally relates to integrated circuits, and more particularly to integrating embedded dynamic random access memory (eDRAM) onto the same chip as III-V semiconductor devices.

2. Background of Invention

Embedded dynamic random access memory (eDRAM) is a dynamic random access memory (DRAM) embedded in a logic circuit to function as a high density cache memory. The eDRAM provides comparable access time as static random access memory (SRAM) at a smaller device area per cell. Typically, eDRAM arrays are employed as an L2 level cache or L3 level cache in a processor to provide a high density memory in a processor core. Due to high performance and a compact size, eDRAM has become one of the most efficient means for continued performance of semiconductor logic circuits requiring embedded memory including processors and system-on-chip (SoC) devices.

III-V semiconductor materials have electro-optical and carrier transport properties useful in semiconductor devices. Namely, high electron mobility allowing for increased current drive make III-V materials particularly attractive. Semiconductor devices formed from III-V semiconductor materials, otherwise referred to as III-V semiconductor devices or III-V devices, are promising for high-speed logic devices and for microwave uses. Further, III-V devices have been identified as one potential candidate to aid in the future scaling of integrated circuits.

Compound semiconductors are semiconductor compounds composed of elements from two or more different groups of the Periodic Table of Elements. The term III-V compound semiconductor or III-V semiconductor materials as used throughout the present application, denotes a semiconductor material that includes at least one element from Group 13 (B, Al, Ga, In) and at least one element from Group 15 (N, P, As, Si, Bi) of the Periodic Table of Elements. Typically, the III-V materials are binary, ternary or quaternary alloys including III/V elements. The range of possible formulae is quite broad because these elements can form binary (two elements, e.g., GaAs), ternary (three elements, e.g., InGaAs) and quaternary (four elements, e.g., AlInGaP).

SUMMARY

According to one embodiment of the present invention, a method is provided. The method may include forming an oxide layer on a top of a substrate; forming a deep trench capacitor in the substrate; bonding a III-V compound semiconductor to a top surface of the oxide layer; and forming a III-V device in the III-V compound semiconductor.

According to another embodiment, a structure is provided. The structure may include a deep trench capacitor in a substrate; and a III-V compound semiconductor above the substrate and above the deep trench capacitor.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1 illustrates the formation of a deep trench in a pad layer and a substrate according to an exemplary embodiment.

FIG. 2 illustrates the formation of a deep trench capacitor according to an exemplary embodiment.

FIG. 3 illustrates the formation of a buffer layer and a III-V device layer on top of a donor wafer according to an exemplary embodiment.

FIG. 4 illustrates bonding the III-V device layer to the structure above the deep trench capacitor according to an exemplary embodiment.

FIG. 5 illustrates the formation of a III-V device according to an exemplary embodiment.

FIG. 6 illustrates the formation of a contact to the III-V device electrically connecting the III-V device to an inner electrode of the deep trench capacitor according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
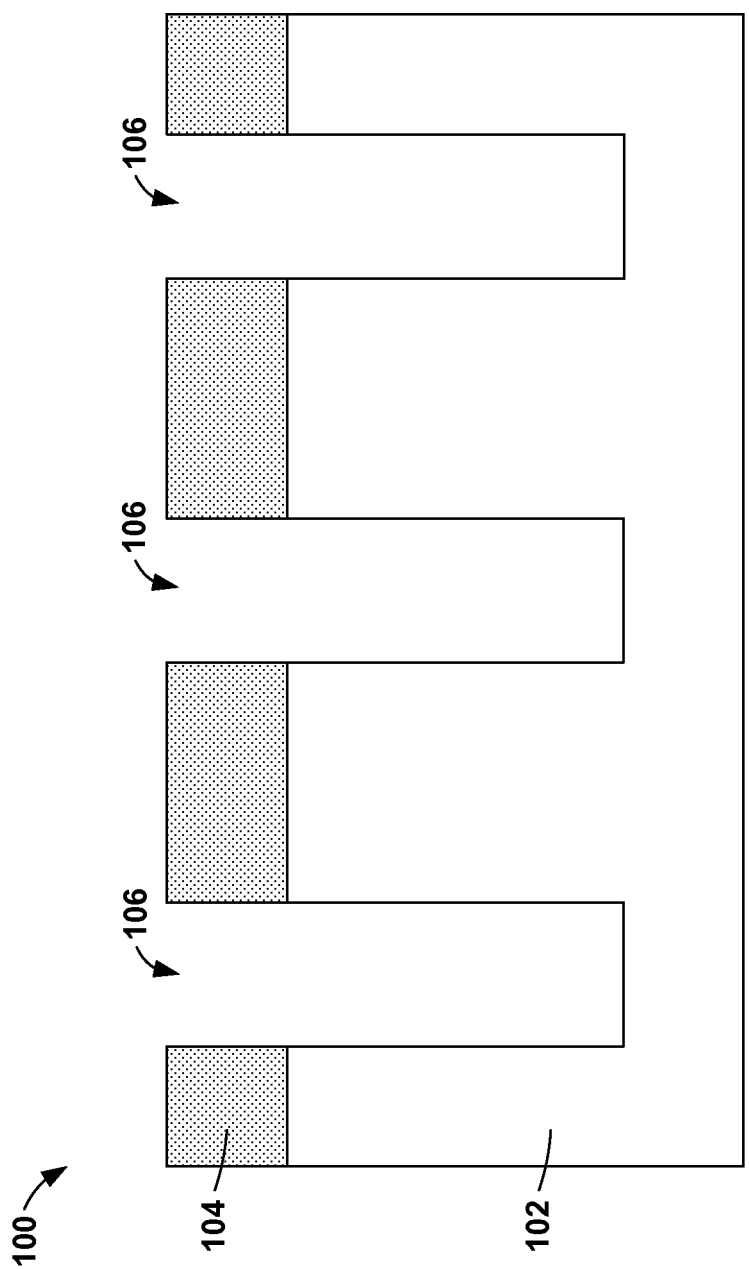
FIGS. 1-6 illustrate the steps of a method of forming a memory device structure according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Referring now to FIGS. 1-6 exemplary process steps of forming a deep trench capacitor and a III-V semiconductor device (hereinafter "III-V device") on the same integrated circuit in accordance with one embodiment of the present invention are shown. Specifically, a deep trench may first be etched into a substrate using conventional processes known in the art. Next, a deep trench capacitor may be formed within the deep trench. Finally, a III-V device may be formed adjacent to the deep trench capacitor. The III-V device may be electrically coupled to the deep trench capacitor to form a memory device structure. It should be noted that while reference is made to a single deep trench capacitor and a single III-V device, multiple deep trench capacitors and multiple III-V devices are depicted in the drawings and a single integrated circuit may include multiple deep trench capacitors and multiple III-V devices. Below is a detail description of the integrated circuit having both the deep trench capacitor and the III-V device.

FIG. 1 is a demonstrative illustration of a structure 100 during an intermediate step of a method of a memory device structure including a III-V device and a deep trench capacitor integrated on the same wafer according to one embodiment. More specifically, the method may begin with forming a deep trench in a substrate. The structure 100 may include a bulk substrate 102 and a pad layer 104. The bulk substrate 102 used in the present embodiment may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Typically the bulk substrate 102 may be about, but is not limited to, several hundred microns thick. For example, the bulk substrate 102 may have a thickness ranging from 0.5 mm to about 1.5 mm.

The pad layer 104 may include a dielectric. For example, the pad layer 104 may include silicon nitride, which may be formed by chemical vapor deposition, such as for example, low pressure chemical vapor deposition (LPCVD), rapid thermal chemical vapor deposition (RTCVD), plasma enhanced chemical vapor deposition (PECVD), and high density plasma chemical vapor deposition (HDPCVD). Alternatively, the pad layer 104 may include silicon oxide formed by one of the CVD techniques above. The thickness of the pad layer 104 may range from about 40 nm to about 300 nm, and typically from about 80 nm to about 150 nm, although lesser and greater thickness may be contemplated. The pad layer 104 may protect the bulk substrate 102 from subsequent fabrication processes.

A deep trench 106 may then be formed using known patterning techniques, such as for example, a lithography process followed by etching process. The term "deep trench" denotes a trench formed in a semiconductor substrate having a sufficient depth to form a capacitor. As such, a deep trench may typically denote a trench having a depth equal to or greater than 1 micron, whereas a shallow trench may typically refer to a trench having a depth less than 1 micron. While the present embodiment may be described with a deep trench, the present embodiment may be employed with a trench having any depth into the bulk substrate 102. Such variations are explicitly contemplated herein.

The lithography technique may include applying a photoresist (not shown) to an upper surface of the pad layer 104, exposing the photoresist to a desired pattern of radiation and developing the exposed photoresist utilizing a conventional resist developer. The pattern in the photoresist may then be transferred to the pad layer 104 and the bulk substrate 102 using one or more dry etching techniques to form the deep trench 106. Suitable dry etching techniques may include, but are not limited to: reactive ion etching (RIE), ion beam etching, plasma etching, or laser ablation. The patterned photoresist may then be removed by resist stripping after etching has been completed. In one embodiment, a hardmask layer, such as an oxide (not shown), may be deposited on top of the pad layer 104 to facilitate the formation of the deep trench. The hardmask layer may be removed after the formation of the deep trench. In other instances, the pad layer 104 may function as the hardmask.

Figure 2:
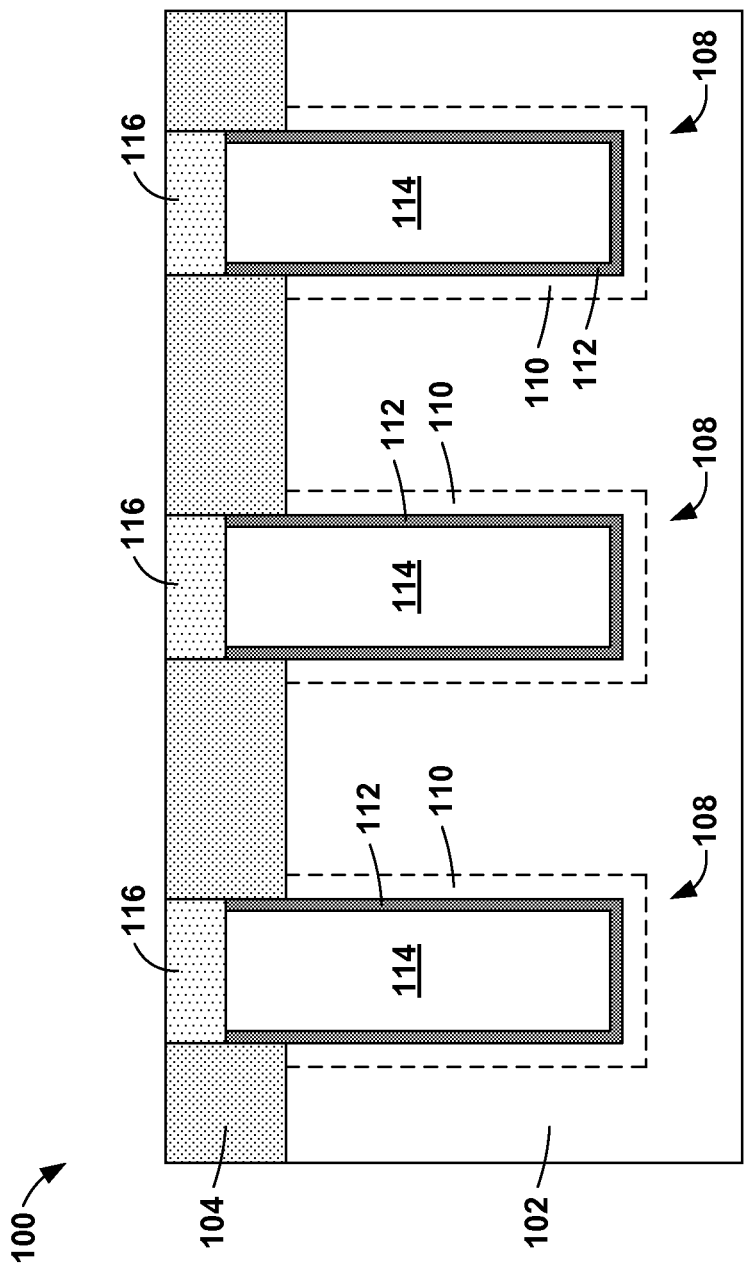

FIG. 2 is a demonstrative illustration of the structure 100 during an intermediate step of a method of the memory device structure including the III-V device and the deep trench capacitor integrated on the same wafer according to one embodiment. More specifically, the method may include the formation of a deep trench capacitor 108 in the deep trench 106 (FIG. 1). The deep trench capacitor 108 may include a buried plate 110, a node dielectric 112, and an inner electrode 114. The buried plate 110 and the inner electrode 114 may serve as the two electrical conductors and the node dielectric 112 may serve as the insulator between the two conductors.

A blanket doping technique may be used to form the buried plate 110. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation to dope the sidewalls and the bottom of the deep trench 106, FIG. 1. In doing so, dopants may be introduced into the bulk substrate 102 to form the buried plate 110. Typical dopants may include As, P, Sb, B, Ga, and In. The pad layer 104 may protect the top surface of the bulk substrate 102 from being doped by the ion implantation. Because of the pad layer 104, no special techniques may be required to mask or protect the bulk substrate 102 from the diffusion of unwanted dopants.

During the multiple rounds of angled ion implantation, the direction and the tilt of the implanted ions may be changed so that the buried plate 110 surrounds the perimeter of the deep trench 106 (FIG. 1), at any depth between the bottom surface of the pad layer 104 and the bottom surface of the deep trench 106 (FIG. 1). The angle of implantation, as measured from a vertical line, may range from about 1 degree to about 5 degrees, and typically from 2 degrees to about 3 degrees, although lesser and greater angles may be explicitly contemplated. The dose and energy of the angled ion implantation may be selected to provide a sufficiently high dopant concentration and volume to the buried plate 110, which may be typically expanded during subsequent thermal treatments. Typical dopant concentration of the buried plate 110 after thermal treatments may range from about $1.0 \times 10^{18}/cm^3$ to about $1.0 \times 10^{21}/cm^3$, although higher and lower dopant concentrations may be explicitly contemplated.

Lateral thickness of the buried plate 110, as measured from the sidewall of the deep trench 106 (FIG. 1), to an outer wall of the buried plate 110, prior to a thermal treatment, may range from about 5 nm to about 100 nm, and typically from about 10 nm to about 50 nm, although lesser and greater thicknesses may be explicitly contemplated. Lateral thickness of the buried plate 110, after a thermal treatment, may range from about 5 nm to about 300 nm, and typically from about 10 nm to about 150 nm, although lesser and greater thicknesses mat be explicitly contemplated.

With continued reference to FIG. 2, the node dielectric 112 may then be formed within the deep trench 106 (FIG. 1), and directly on the buried plate 110 and the sidewalls of the pad layer 104. The node dielectric 112 may include a dielectric such as silicon oxide, silicon nitride, silicon oxynitride. The thickness of the node dielectric 112 may range from about 2 nm to about 6 nm. Alternately, the node dielectric 112 may include a high-k material having a dielectric constant greater than the dielectric constant of silicon nitride, which is about 7.5. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.5 to about 3 and each value of y may independently range from 0 to about 2. In this case, the thickness of the node dielectric 112 may range from about 2 nm to about 4 nm, although lesser and greater thickness may be contemplated. In one embodiment, the node dielectric 112 may include a combination of multiple materials.

Next, the inner electrode 114 may be formed by depositing a conductive material on the inner walls of the node dielectric 114. The inner electrode 114 may be a doped semiconductor material or a metal. If the inner electrode 114 is a doped semiconductor material, the doped semiconductor material may include any material listed above for the bulk substrate 102. The dopants may be a p-type dopant or an n-type dopant. The doped semiconductor material may be deposited by chemical vapor deposition such as low pressure chemical vapor deposition (LPCVD).

If the inner electrode 114 is an elemental metal, exemplary elemental metals may include Ta, Ti, Co, and W. Alternatively, inner electrode 114 may be a conductive metallic alloy, and exemplary conductive metallic alloys may include a mixture of elemental metals, a conductive metallic nitride such as TiN, ZrN, HfN, VN, NbN, TaN, WN, TiAlN, TaCN, and an alloy thereof. The inner electrode 114 may be formed by known suitable deposition techniques, for example, chemical vapor deposition (CVD), physical vapor deposition (PVD), or atomic layer deposition (ALD).

Excess conductive material that may be deposited outside the deep trench 106 (FIG. 1), may be removed by a recess etch or chemical mechanical planarization. The node dielectric 112 or the pad layer 104 may be used to sense an endpoint during the recess etch, or alternately, may be employed as a stopping layer during the chemical mechanical planarization.

Once the excess conductive material is removed from outside the deep trench 106 (FIG. 1), a dielectric cap 116 may be formed at the top of the deep trench capacitor 108. Preferably, the dielectric cap 116 is an oxide and may be formed by suitable etching and deposition techniques known in the art. First, the node dielectric 112 and the inner electrode 114 may be recessed by a suitable wet or a dry etching technique. Suitable dry etching techniques may include, but are not limited to: reactive ion etching (RIE), ion beam etching, plasma etching, or laser ablation. Second, the dielectric cap 116 may be deposited within the recessed opening.

The dielectric cap 116 may include a dielectric oxide such as silicon oxide, silicon oxynitride, or high-k materials. The dielectric cap 116 may be formed by any known suitable deposition technique, for example, thermal oxidation, chemical vapor deposition (CVD), physical vapor deposition (PVD), or atomic layer deposition (ALD). In one embodiment, the thickness of the dielectric cap 116 may range from about 10 nm to about 100 nm, and typically from about 30 nm to about 60 nm, although lesser and greater thicknesses may be explicitly contemplated.

Figure 3:
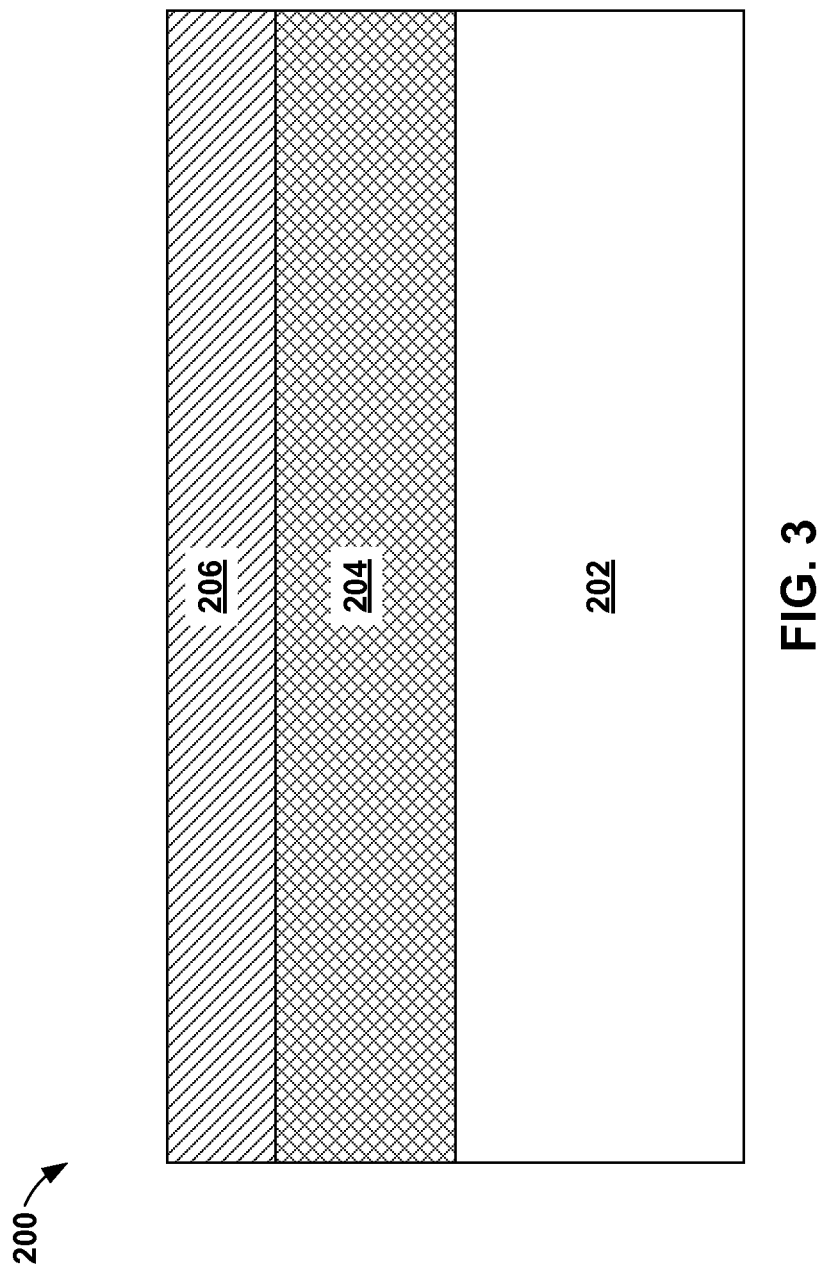

FIG. 3 is a demonstrative illustration of a structure 200 during an intermediate step of a method of the memory device structure including the III-V device and the deep trench capacitor integrated on the same wafer according to one embodiment. More specifically, the method may include providing a donor wafer 202, separate from the structure 100 (FIG. 2). Techniques well known in the art may be used to form a buffer layer 204 formed on top of the donor wafer 204. Similarly, techniques well known in the art may be used to form a III-V device layer 206 on top of the buffer layer 204. In one embodiment, the donor wafer 202 may be any typical silicon wafer. The III-V device layer 206 may include any III-V compound semiconductor known in the art. As is well known in the art, the term III-V compound semiconductor or III-V semiconductor materials denotes a semiconductor material that includes at least one element from Group 13 (such as, for example, B, Al, Ga, In) and at least one element from Group 15 (such as, for example, N, P, As, Si, Bi) of the Periodic Table of Elements. Examples of III-V materials applicable to the present invention may include, but are not limited to, the following alloys: GaAs, InAs, InP, InGaAs, InAlAs, InAlAsSb, InAlAsP and InGaAsP.

In one embodiment, according to known techniques, the buffer layer 204 may be used to change the lattice constant to allow the formation of the III-V device layer 206. For example, in one embodiment, the buffer layer 204 may include silicon and germanium, and the III-V device layer 206 may include gallium and arsenic. In one embodiment, the silicon concentration of the buffer layer 204 may be high relative to the germanium concentration adjacent to the donor wafer 202, and the germanium concentration of the buffer layer 204 may be high relative to the silicon concentration adjacent to the III-V device layer 206.

Figure 4:
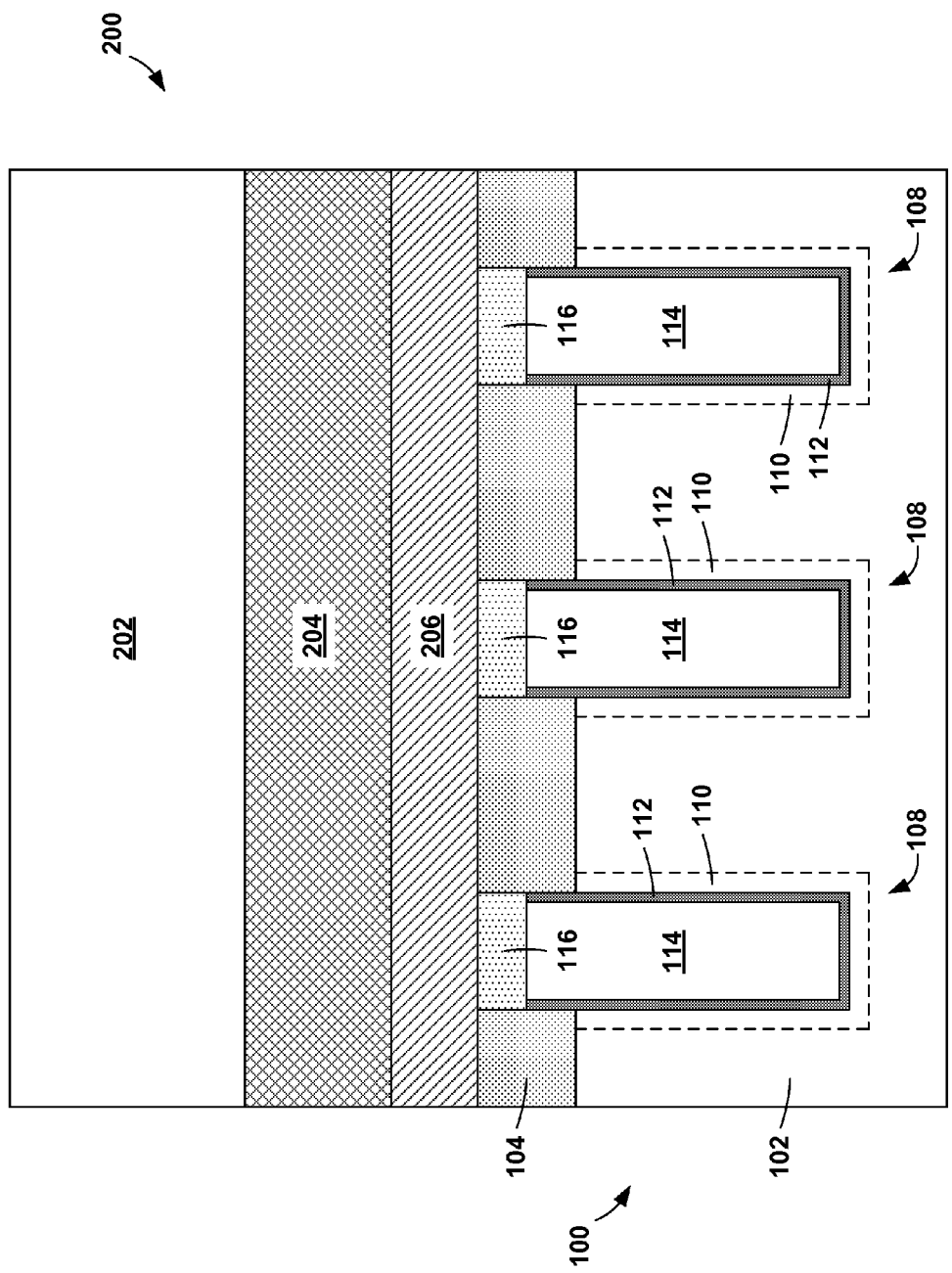

FIG. 4 is a demonstrative illustration of the structure 100 during an intermediate step of a method of the memory device structure including the III-V device and the deep trench capacitor integrated on the same wafer according to one embodiment. More specifically, the method may include bonding the III-V device layer 206 to a top surface of the structure 100 above the deep trench capacitor 108. In doing so, the structure 200 may be flipped and the III-V device layer 206 may be bound to the structure 100 using wafer bonding techniques well known in the art. A smart cut process or a wet etch technique may be used to remove both the buffer layer 204 and the donor wafer 202, as shown in FIG. 5.

Figure 5:
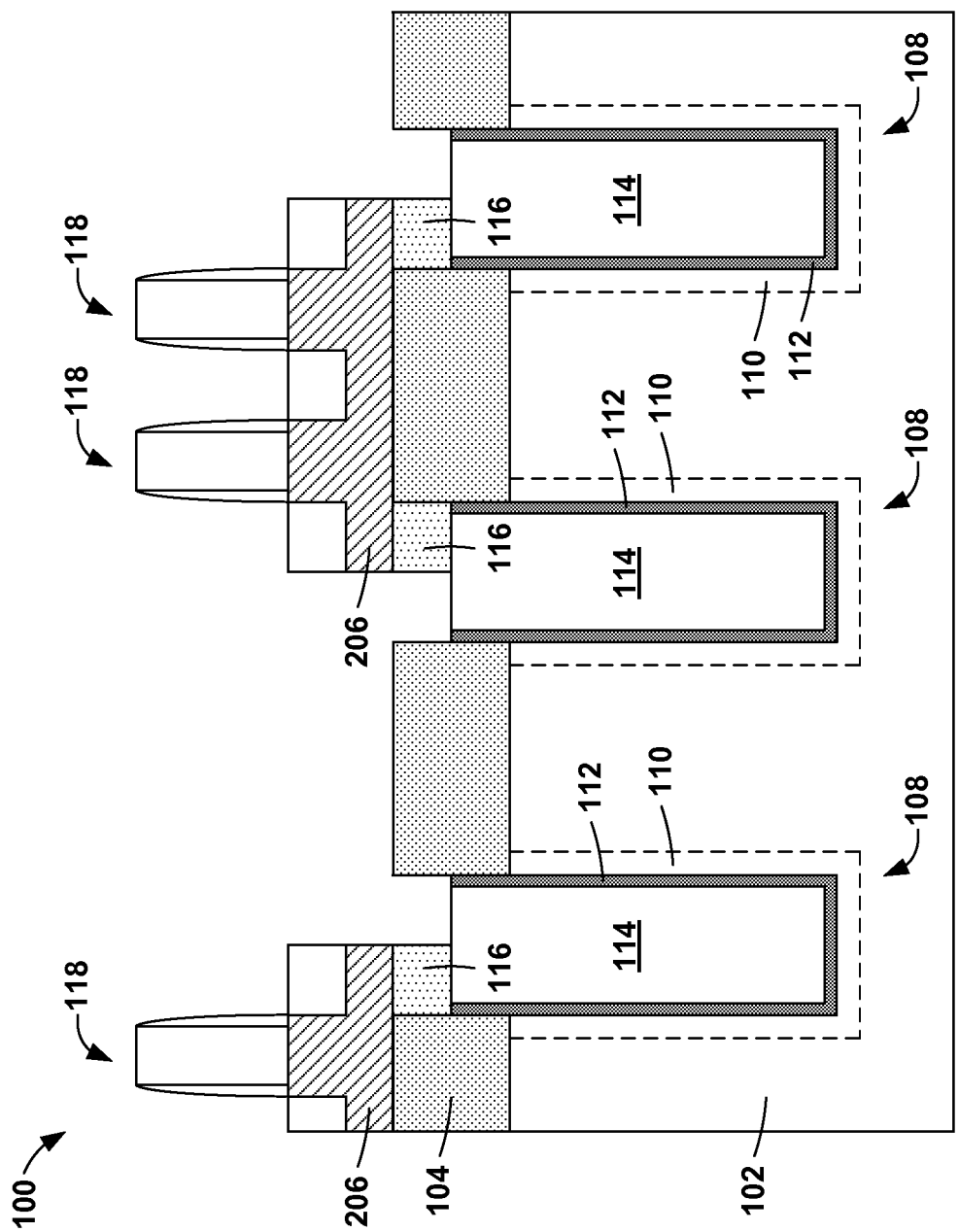

FIG. 5 is a demonstrative illustration of the structure 100 during an intermediate step of a method of the memory device structure including the III-V device and the deep trench capacitor integrated on the same wafer according to one embodiment. More specifically, the method may include forming a III-V device 118 in the III-V device layer 206. The structure 100 is shown having a transistor, for example, the III-V device 118 above and adjacent to the deep trench capacitor 108. The deep trench capacitor 108 and the III-V device 118 may together form, for example, an embedded DRAM memory cell. Typical lithography techniques known in the art may be used to form the III-V device 118. Additional dielectric isolation regions (not shown) may be formed between on or more memory cells to electrically insulate one from another.

Figure 6:
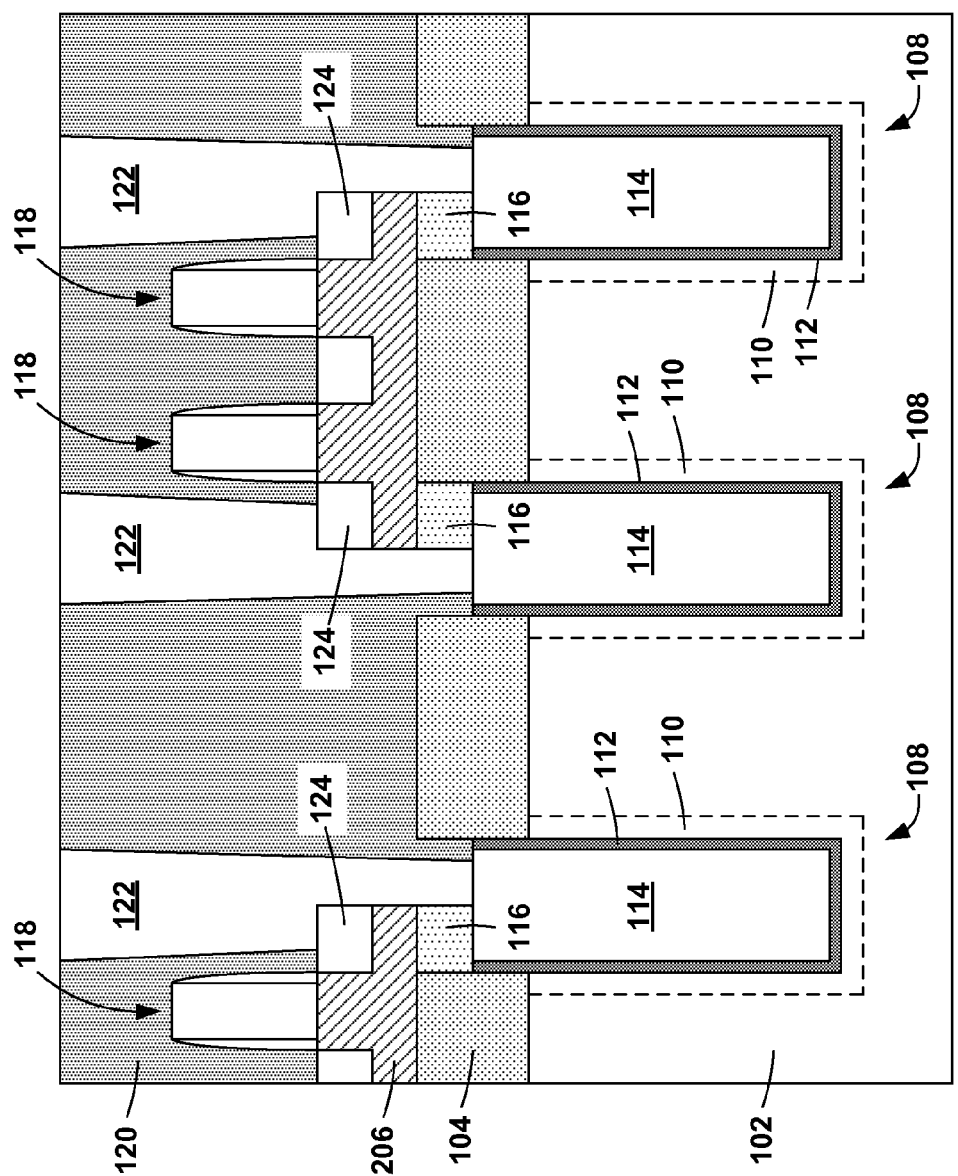

FIG. 6 is a demonstrative illustration of the structure 100 during an intermediate step of a method of the memory device structure including the III-V device and the deep trench capacitor integrated on the same wafer according to one embodiment. More specifically, the method may include the formation of a contact level. A contact-level dielectric 120 may be deposited on top of the structure 100 using any suitable deposition technique known in the art. In one embodiment, the contact-level dielectric 120 may include, but is not limited to, a material made from, a nitride, an oxide, a carbide, or any combination of these materials. In one embodiment, the contact-level dielectric 120 may include an oxide deposited using a CVD technique. The contact-level dielectric 120 may have a thickness ranging from about 20 nm to 100 nm, although a thickness of the contact-level dielectric 120 less than 20 nm or greater than 100 nm may be acceptable. The contact-level dielectric 120 may be planarized using a chemical mechanical polishing technique after being formed on top of the structure 100.

Contact trenches may then be formed by etching through the contact-level dielectric 120 to make electrical connections with the III-V device 118 formed in the III-V device layer 206. A contact 122 may extend from a top surface of the contact-level dielectric 120 to a source/drain region 124 of the III-V device 118 and an exposed top surface of the inner electrode 114 of the deep trench capacitor 108. One skilled in the art may recognize that the contact 122 may form an electrical connection between the source/drain region 124 of the III-V device 118 and the inner electrode 114 of the deep trench capacitor 108.

With continued reference to FIG. 6, a conductive material may be deposited to fill the contact trenches and form the contact 122. The conductive material may include any material having a high electrical conductivity. In one embodiment, the conductive material can include, for example, tungsten, copper, aluminum, silver, gold, alloys thereof, and any suitable combination thereof. The conductive material can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The thickness, or depth, of the contact 122 may range from about 20 nm to about 100 nm, although lesser and greater thicknesses may also be contemplated. After deposition, a planarization process, such as for example chemical mechanical polishing, may be performed to remove any excess conductive material above the contact-level dielectric 120.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming an oxide layer on a top surface of a substrate;
   forming a deep trench through the oxide layer and into the substrate;
   forming a buried plate of a deep trench capacitor by doping sidewalls of the substrate exposed within the deep trench using an ion implantation technique, the oxide layer remains and protects a top surface of the substrate from being doped by the ion implantation;
   forming a node dielectric along sidewalls and a bottom of the deep trench;
   forming an inner electrode on top of the node dielectric within the deep trench;
   forming an opening by recessing the node dielectric and the inner electrode; and
   forming a dielectric cap by filling the opening with a dielectric material such that a top surface of the dielectric cap is substantially flush with the top surface of the oxide layer, and
   bonding a III-V compound semiconductor to a top surface of the oxide layer, wherein the dielectric cap is in direct contact with the III-V compound semiconductor.

2. The method of claim 1, wherein the III-V compound semiconductor comprises gallium, arsenic, indium, or some combination thereof.

3. The method of claim 1, further comprising:
   forming a III-V semiconductor device in the III-V compound semiconductor.

4. The method of claim 1, wherein the III-V semiconductor material comprises at least one element from Group 13 and at least one element from Group 15 of the Periodic Table of Elements.

5. The method of claim 1, wherein bonding the III-V compound semiconductor to the top surface of the oxide layer comprises:
   growing a buffer layer on a donor wafer;
   growing the III-V compound semiconductor on the buffer layer;
   touching a top surface of the III-V compound semiconductor to the top surface of the oxide layer; and
   removing the buffer layer and the donor wafer.

6. The method of claim 1, further comprising:
   forming a node dielectric on top of the buried plate within the deep trench, the node dielectric extending along sidewalls of the oxide layer and along the sidewalls of the substrate.

7. The method of claim 1, further comprising:
   forming an electrical connection between an inner electrode of the deep trench capacitor and a source-drain region of a III-V semiconductor device by forming a contact above and in direct contact with the inner electrode and the source-drain region.

8. A method comprising:
   forming an oxide layer on a top of a substrate;
   forming a deep trench through the oxide layer and into the substrate, the deep trench extending from an upper surface of the oxide layer down to a level within the substrate;
   forming a buried plate of a deep trench capacitor by doping sidewalls of the substrate exposed within the deep trench using an ion implantation technique, the oxide layer remains and protects a top surface of the substrate from being doped by the ion implantation;
   forming a node dielectric along sidewalls and a bottom of the deep trench;
   forming an inner electrode on top of the node dielectric within the deep trench;
   forming an opening by recessing the node dielectric and the inner electrode; and
   forming a dielectric cap by filling the opening with a dielectric material such that a top surface of the dielectric cap is substantially flush with the top surface of the oxide layer,
   bonding a III-V compound semiconductor to a top surface of the oxide layer, the dielectric cap being in direct contact with the III-V compound semiconductor; and
   forming a III-V semiconductor device in the III-V compound semiconductor.

9. The method of claim 8, wherein bonding the III-V compound semiconductor to the top surface of the oxide layer comprises:
   growing a buffer layer on a donor wafer;
   growing the III-V compound semiconductor on the buffer layer;
   touching a top surface of the III-V compound semiconductor to the top surface of the oxide layer; and
   removing the buffer layer and the donor wafer.

10. The method of claim 8, wherein the III-V semiconductor material comprises at least one element from Group 13 of the Periodic Table of Elements and at least one element from Group 15 of the Periodic Table of Elements.

11. The method of claim 8, wherein the III-V compound semiconductor comprises gallium, arsenic, or some combination thereof.

12. The method of claim 8, wherein the III-V compound semiconductor comprises gallium, arsenic, indium, or some combination thereof.

13. The method of claim 8, further comprising:
   forming an electric contact above and in direct contact with an inner electrode of the deep trench capacitor, the contact overlaps and is in direct contact with a source-drain region of the III-V semiconductor device.

* * * * *